US011959002B2

(12) United States Patent
Brgoch et al.

(10) Patent No.: US 11,959,002 B2
(45) Date of Patent: Apr. 16, 2024

(54) BLUE-EMITTING PHOSPHORS AND METHODS OF USE THEREOF

(71) Applicant: University of Houston System, Houston, TX (US)

(72) Inventors: Jakoah Brgoch, Houston, TX (US); Shruti Hariyani, Houston, TX (US)

(73) Assignee: University of Houston System, Houston, TX (US)

( * ) Notice: Subject to any disclaimer, the term of this patent is extended or adjusted under 35 U.S.C. 154(b) by 0 days.

(21) Appl. No.: 17/530,924

(22) Filed: Nov. 19, 2021

(65) Prior Publication Data

US 2022/0186116 A1  Jun. 16, 2022

Related U.S. Application Data

(60) Provisional application No. 63/116,017, filed on Nov. 19, 2020.

(51) Int. Cl.
| | | |
|---|---|---|
| C09K 11/77 | (2006.01) | |
| C01F 17/10 | (2020.01) | |
| C01F 17/30 | (2020.01) | |
| H01L 33/50 | (2010.01) | |

(52) U.S. Cl.
CPC .......... C09K 11/7739 (2013.01); C01F 17/10 (2020.01); C01F 17/30 (2020.01); H01L 33/502 (2013.01); *C01P 2006/60* (2013.01)

(58) Field of Classification Search
CPC ............................ C09K 11/7739; H01L 33/502
See application file for complete search history.

(56) References Cited

U.S. PATENT DOCUMENTS

| | | |
|---|---|---|
| 6,555,958 B1 | 4/2003 | Srivastava et al. |
| 6,685,852 B2 | 2/2004 | Setlur et al. |

FOREIGN PATENT DOCUMENTS

| | | |
|---|---|---|
| CN | 103086394 A | 9/2014 |
| EP | 2157152 B1 | 11/2012 |
| WO | WO 2018055849 | * 3/2018 |

OTHER PUBLICATIONS

Huang et al., "Novel Green-emitting Na2CaPO4F:Eu2+ phosphors for near-ultraviolet white light emitting diodes", Jornal of Luminescence, 131(2011, pp. 1346-1349, Mar. 3, 2011.*

Dhoble et al., "Combustion synthesis of Dy 3+, Eu 3+ activated Na 2 X(PO 4)F (X=Mg, Ca, Sr) phosphors for lamp industry", *European Physical Journal Applied Physics*, 52(1), 1-11 (Sep. 17, 2010).

Duke et al., "Ba$_3$Y$_2$B$_6$O$_{15}$:Ce$^{3+}$-A high symmetry, narrow-emitting blue phosphor for wide-gamut white lighting." *Chem. Mater.*, 30(8), 2668-2675, 2018.

International Search Report and Written Opinion for International Application No. PCT/US2021/060016 dated Feb. 24, 2022, 16 pages.

(Continued)

*Primary Examiner* — C Melissa Koslow

(74) *Attorney, Agent, or Firm* — Parker Highlander PLLC

(57) ABSTRACT

Provided herein are phosphors of the general molecular formula:

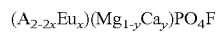

$(A_{2-2x}Eu_x)(Mg_{1-y}Ca_y)PO_4F$ wherein the variables are as defined herein. Methods of producing the phosphors are also provided. In some aspects, the present disclosure provides light-emitting devices comprising these phosphors.

19 Claims, 7 Drawing Sheets

(56) References Cited

OTHER PUBLICATIONS

Liao et al., "Learning from a Mineral Structure toward an Ultra-Narrow-Band Blue-Emitting Silicate Phosphor $RbNa_3(Li_3SiO_4)_4$:$Eu^{2+}$", *Angew. Chem. Int. Ed.*, 57:11728-11731, 2018.

Mishra et al., "Investigation of Fluorescence Degradation Mechanism of Hydrated $BaMgAl_{10}O_{17}$:$Eu^{2+}$ Phosphor", *J. Electrochem. Soc.*, 152:H183-H190, 2005.

Oshio, "Mechanism of Luminance Decrease in $BaMgAl_{10}O_{17}$:$Eu^{2+}$ Phosphor by Oxidation", *J. Electrochem. Soc.*, 145:3903, 1998.

Song et al., "$RbBaPO_4$:$Eu^{2+}$: a new alternative blue-emitting phosphor for UV-based white light-emitting diodes.", *J. Mater. Chem. C.* 1(3), 500-505, 2013.

Schubert et al., "Solid-State Light Sources Getting Smart", *Science*, 308:1274-1278, 2005.

Swafford et al., "New synthetic approaches to monophosphate fluoride ceramics: synthesis and structural characterization of $Na_2Mg(PO_4)F$ and $Sr_5(PO_4)_3F$", *Solid State Sci.*, 4:807-812, 2002.

Navigant Consulting, "Energy Savings Forecast of Solid-State Lighting in General Illumination Applications", United States Dept. of Energy, Navigant Consulting Inc., 2016.

\* cited by examiner

BLUE-EMITTING PHOSPHORS AND METHODS OF USE THEREOF

REFERENCE TO RELATED APPLICATIONS

This application claims the benefit of priority to U.S. Provisional Application No. 63/116,017, filed on Nov. 19, 2020, the entire contents of which is hereby incorporated by reference.

FEDERAL GRANT SUPPORT

The invention was made with government support under Grant No. 19-11311 awarded by the National Science Foundation. The government has certain rights in the invention.

BACKGROUND OF THE INVENTION

I. Field of the Invention

The present invention relates generally to the fields of chemistry and physics. More particularly, it concerns phosphors that emit a band of light as well as methods of making and light-emitting devices comprising said phosphors.

II. Description of Related Art

Replacing a traditional light bulb with an energy-efficient, phosphor-converted white light emitting diode (pc-LED) is one of the most convenient and promising methods to decrease electricity consumption dramatically. Typically, white light is produced by combining a near-UV LED chip with a green, red, and blue-emitting phosphor. For a phosphor to be utilized in these devices, they must possess an extremely efficient and thermally stable emission. Therefore, the complete conversion to pc-LED based lighting requires the development of red, green, and blue-emitting materials that meet these requirements.

Presently, only a few blue-emitting phosphors satisfy the proposed criteria and are competitive for commercial applications. The most popular blue-emitter is $BaMgAl_{10}O_{17}$:$Eu^{2+}$(BAM:$Eu^{2+}$). This material has been used in many applications ranging from domestic lighting to plasma display based technologies due to its high efficiency upon excitation from the UV to the visible region. Indeed, the photoluminescence quantum yield (PLQY) of this industry-standard material approaches 100% under 365 nm excitation and it 90% with 400 nm excitation following years of optimization. The main drawback of this material is that it can be readily hydrolyzed and oxidized upon prolonged operation, causing drastic shifts in the emission wavelength and a decrease in the emission intensity. Other materials such as $Ba_3Y_2B_6O_{15}$:$Ce^{3+}$ and $RbNa_3(Li_3SiO_4)_4$:$Eu^{2+}$ require improvements before they can be widely used in devices. $Ba_3Y_2B_6O_{15}$:$Ce^{3+}$ loses 50% of its emission intensity at 394 K, which is far below the temperatures at which pc-LEDs typically operate (420 K). $RbNa_3(Li_3SiO_4)_4$:$Eu^{2+}$, on the other hand, has been successfully integrated into pc-LED devices but is composed of Rb, which makes producing devices out of this material expensive due to the scarcity of the alkali metal. Therefore, there is a significant need for new rare-earth substituted inorganic blue-emitting phosphors composed of readily available elements with long-wavelength excitation and thermally stable emission.

SUMMARY OF THE INVENTION

In some aspects, the present disclosure provides phosphors of the general molecular formula:

$(A_{2-2x}Eu_x)(Mg_{1-y}Ca_y)PO_4F$, wherein:
A is one or more alkali metal;
0<x≤0.25; and
y=0.

In some embodiments, A is sodium (I). In some embodiments, 0.005<x≤0.25, such as 0.005, 0.01, 0.02, 0.04, or 0.06. In some embodiments, the phosphor is further defined as $Na_{1.92}Eu_{0.04}MgPO_4F$. In some embodiments, the phosphor has an excitation spectrum peak at an excitation wavelength from about 260 nm to about 450 nm, such as 275 nm, 340 nm, or 400 nm. In some embodiments, the phosphor has an emission spectrum peak at an emission wavelength from about 400 nm to about 500 nm, such as about 450 nm. In some embodiments, the emission spectrum peak has a full width at half-maximum (FWHM) of from about 50 nm to about 100 nm, such as about 79 nm.

In other aspects, the present disclosure provides methods for producing a phosphor of the present disclosure, wherein the method comprises:
a) mixing starting materials of the phosphor to produce a first reaction mixture, wherein the starting materials of the phosphor comprise one or more alkali metal sources, a magnesium source, a phosphate source, a fluoride source, and a europium source; and
b) heating the first reaction mixture to a first temperature to produce the phosphor.

In some embodiments, the alkali metal source is a sodium source. In further embodiments, the sodium source is a sodium salt, such as $Na_2CO_3$. In some embodiments, the magnesium source is a magnesium salt, such as MgO. In some embodiments, the phosphate source is a phosphate salt, such as $NH_4H_2PO_4$. In some embodiments, the fluoride source is a fluoride salt, such as $MgF_2$. In some embodiments, the europium source is a europium salt or a europium oxide, such as europium (III) oxide. In some embodiments, the first temperature is from about 725° C. to 925° C., such as about 825° C. In some embodiments, mixing is performed in air and heating is performed in a reducing atmosphere. In some embodiments, the reducing atmosphere comprises $H_2$, CO, or $NH_3$, and optionally further comprises a diluent gas, such as $N_2$, helium, neon, argon, krypton, xenon, or any combination thereof.

In still other aspects, the present disclosure provides light-emitting devices comprising:
a) an excitation light source that emits primary light; and
b) a phosphor of the present disclosure, wherein the phosphor is a blue-emitting phosphor.

In some embodiments, the excitation light source is a semiconductor light source, such as a light-emitting diode (LED) or laser diode (LD). In some embodiments, the primary light has a wavelength from about 350 nm to about 450 nm, such as about 370 nm or about 405 nm. In some embodiments, the light-emitting device further comprises a green-emitting phosphor, a red-emitting phosphor, or a combination thereof.

Other objects, features, and advantages of the present invention will become apparent from the following detailed description. It should be understood, however, that the detailed description and the specific examples, while indicating specific embodiments of the invention, are given by way of illustration only, since various changes and modifications within the spirit and scope of the invention will become apparent to those skilled in the art from this detailed description. Note that simply because a particular compound is ascribed to one particular generic formula doesn't mean that it cannot also belong to another generic formula.

BRIEF DESCRIPTION OF THE DRAWINGS

The following drawings form part of the present specification and are included to further demonstrate certain aspects of the present disclosure. The disclosure may be better understood by reference to one or more of these drawings in combination with the detailed description of specific embodiments presented herein.

FIG. 3A shows the excitation and emission spectra of $(Na_{1.92}Eu_{0.04})MgPO_4F$. The dashed, light grey line is the fit. FIG. 3B shows the room temperature photoluminescent quantum yield of $(Na_{2-2x}Eu_x)MgPO_4F$ (x=0.005, 0.01, 0.02, 0.04 and 0.06) under 365 nm (light grey) and 400 nm (dark grey) excitation. FIG. 3C shows the CIE coordinates of $(Na_{1.92}Eu_{0.04})MgPO_4F$ lie further in the within the NTSC and Rec. 2020 triangle, allowing a wide gamut to be produced when combined with β-SiAlON:$Eu^{2+}$ and $Sr_2Si_5N_8$:$Eu^{2+}$.

FIG. 7A shows normalized emission spectra of $(Na_{1.92}Eu_{0.04})MgPO_4F$ after water immersion for 21 days and annealing at 80, 120, 160, and 300° C. for 48 days. FIG. 7B shows the change in room temperature photoluminescent quantum yield after water immersion (diamond) and annealing at 80° C. (down triangle), 120° C. (square), 160° C. (circle), and 300° C. (up triangle).

DESCRIPTION OF ILLUSTRATIVE EMBODIMENTS

Figure 1:
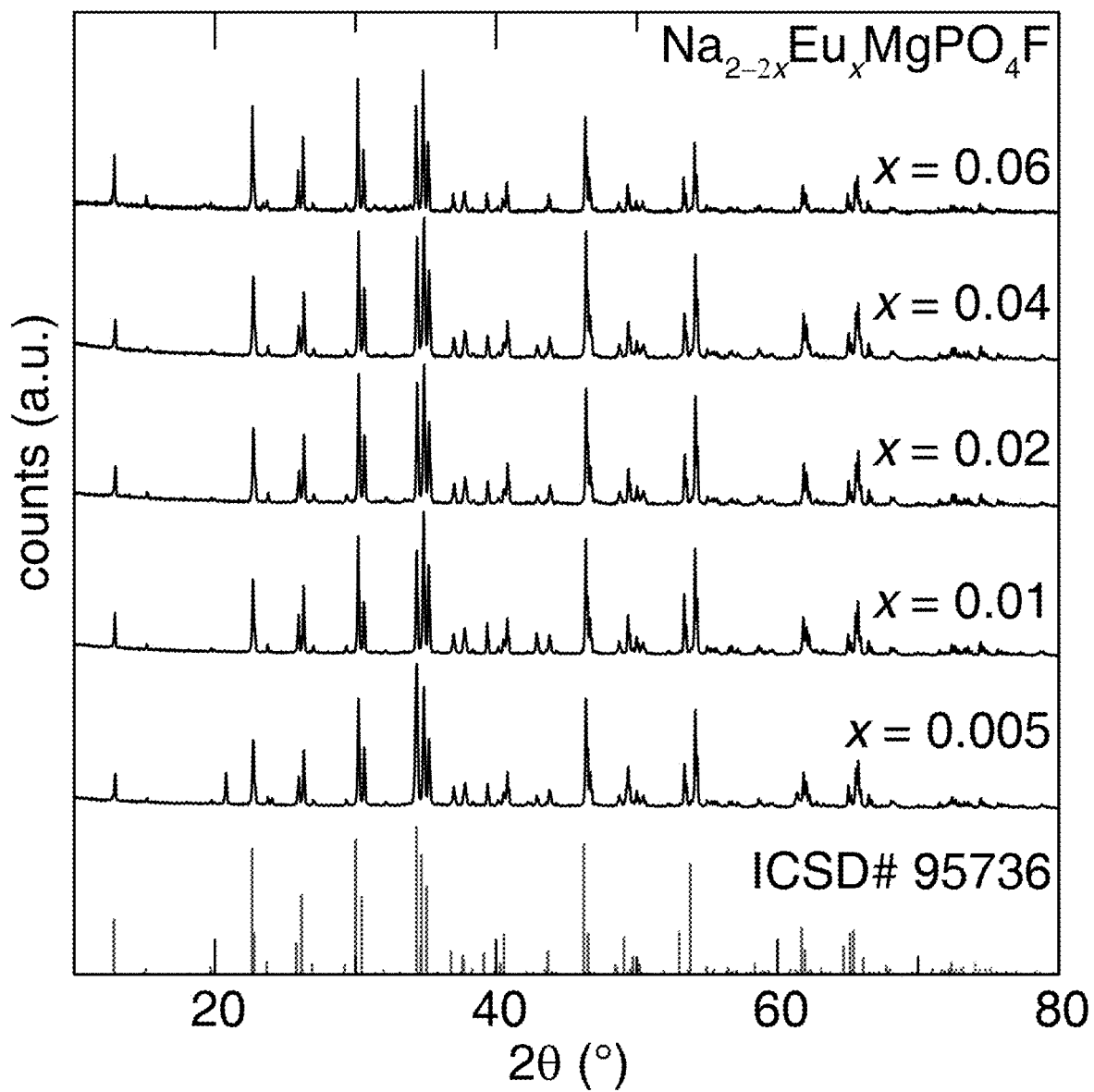
FIG. 1 shows powder X-ray diffractograms of $(Na_{2-2x}Eu_x)MgPO_4F$ (x=0.005, 0.01, 0.02, 0.04 and 0.06).

The present disclosure provides phosphors that efficiently emit blue light, methods for their manufacture, and light-emitting devices comprising said phosphors. In some embodiments, the phosphors provided herein emit blue light in a narrower band than other phosphors in the art. The methods of producing the phosphors provided herein may be performed at atmospheric pressure and may be performed under a reducing atmosphere. The phosphors provided herein may possess emission coordinates that provide a color gamut more suitable to lighting applications than phosphors in the art. In some embodiments, the phosphors may be used in lighting applications. In some embodiments, the phosphors may be used for converting UV or violet light to blue light for use with a light-emitting diode (LED), laser diode (LD), or liquid crystal display (LCD), and a lighting or display apparatus employing the same. In some embodiments, the phosphor is $Na_{1.92}Eu_{0.04}MgPO_4F$.

Lighting accounts for 15% of global energy consumption and solid-state lighting is quickly becoming one of the most convenient and affordable methods to dramatically increase energy savings (U.S. D.O.E., 2016). Solid-state lighting is currently replacing traditional incandescent and fluorescent light bulbs due to their higher efficiencies, longer operating lifetimes, and environmentally benign components. These devices produce white light from a monochromatic LED chip and inorganic phosphor. The most common devices available in stores today consists of a blue InGaN LED chip ($\lambda_{em} \approx 450$ nm) with a yellow-emitting phosphor, such as $Ce^{3+}$ substituted yttrium aluminum garnet. The phosphor absorbs and down-converts the LED's emission to longer wavelengths to cover the majority of the visible spectrum to appear as white light. The lack of a red spectral component, however, creates a blue-tinted white light with a low color rendering index (CRI <75) and high correlated color temperature (CCT >4500K; Schubert and Kim, 2005).

The spectral properties of a phosphor-converted LED device (pc-LED) may be improved by incorporating a UV or violet LED with a red, green, and blue-emitting phosphor. The warm white light generated from this device has the added advantages of color tunability and selectivity. The main consequence of this approach, however, is that the phosphors used in these devices must be highly efficient to overcome the inherent Stokes' loss (Xie et al, 2009). It is further advantageous for the phosphor to have a thermally stable emission to resist changes in emission wavelength and intensity at the elevated temperatures pc-LEDs typically operate. Therefore, a complete conversion to pc-LED-based lighting requires the development of red, green, and blue-emitting materials that meets these requirements.

Presently, only a few blue-emitting phosphors satisfy the proposed criteria and are competitive for commercial applications. The most popular blue-emitter is industry standard $BaMgAl_{10}O_{17}$:$Eu^{2+}$ (BAM:$Eu^{2+}$). This phosphor has been historically used in fluorescent and display lighting due to its high efficiency of 95% upon 340 nm excitation (Duke et al., 2018). Upon 365 nm excitation, the efficiency approaches 100% and decreases slightly to 90% with 400 nm excitation. The phosphor also possesses a narrow emission with a full width at half maximum (fwhm) of 69 nm (3290 cm$^{-1}$). The main drawback of this material is that it is prone to hydrolysis and oxidation of the luminescent center ($Eu^{2+}$ to $Eu^{3+}$) which has been reported to cause a red-shift in the emission wavelength and a dramatic decrease in the emission intensity (Oshio, 1998; Mishra et al., 2005). Another promising material is $RbNa_3(Li_3SiO_4)_4$:$Eu^{2+}$, which has been successfully integrated into pc-LED devices but is composed of Rb, which makes producing devices out of this material expensive due to the scarcity of the alkali metal (Liao et al., 2018). Therefore, new rare-earth substituted inorganic blue-emitting phosphors composed of readily available elements with long-wavelength excitation and thermally stable emission are urgently needed.

This technology describes a composition of matter based on $(Na_{2-2x}Eu_x)MgPO_4F$ that emits in the blue region of the electromagnetic spectrum when excited with UV or violet light. The material is composed of cheap, readily available, non-toxic elements. It can be synthesized with a simple one-step solid-state reaction under normal atmospheric pressure, making large scale production viable. The $(Na_{2-2x}Eu_x)(Mg_{1-y}Ca_y)PO_4F$ (x=0-0.06; y=0) phosphors are highly efficient and are thermally robust, making it a suitable candidate for LED backlighting or general white lighting applications.

I. Compounds of the Present Disclosure

The compounds of the present disclosure (also referred to as "phosphors," "phosphors of the present invention" or "phosphors disclosed herein") are shown, for example, above, in the summary of the invention section, in the Examples below, and in the claims below. They may be made using the synthetic methods outlined in the Examples section. These methods can be further modified and optimized using the principles and techniques of inorganic chemistry as applied by a person skilled in the art. Such principles and techniques are taught, for example, in Cotton and Wilkinson, *Advanced Inorganic Chemistry*, (1988), which is incorporated by reference herein. In addition, the synthetic methods may be further modified and optimized for preparative, pilot- or large-scale production, either batch or continuous, using the principles and techniques of process chemistry as applied by a person skilled in the art.

In some embodiments, the compounds of the present invention have the advantage that they may be more efficacious than, more efficient than, more sensitive than, more efficiently manufactured than, more thermally, chemically, or photolytically stable than, have a better photochemical profile (e.g., narrower emission band, higher optical yield, and/or shorter emission lifetime) than, and/or have other useful physical or chemical properties over, compounds known in the prior art, whether for use in the applications stated herein or otherwise.

Atoms making up the compounds of the present invention are intended to include all isotopic forms of such atoms. Isotopes, as used herein, include those atoms having the same atomic number but different mass numbers. By way of general example and without limitation, isotopes of hydrogen include tritium and deuterium, and isotopes of carbon include $^{13}C$ and $^{14}C$.

In some embodiments, the phosphors of the present disclosure are of the general molecular formula:

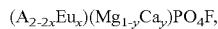

$(A_{2-2x}Eu_x)(Mg_{1-y}Ca_y)PO_4F$, wherein:
  A is one or more alkali metal;
  $0<x\leq0.25$; and
  $y=0$.

In some embodiments, A is a single alkali metal. In some embodiments, A is sodium. In some embodiments, A is sodium (I). In some embodiments, $0<x\leq0.15$. In some embodiments, $0<x\leq0.10$. In some embodiments, $0<x\leq0.05$. In some embodiments, x is 0.04. In some embodiments, the phosphor is further defined as $Na_{1.92}Eu_{0.04}MgPO_4F$. In some embodiments, a crystalline sample of the phosphor has a space group of Pbcn (orthorhombic, space group no. 60). In some embodiments, the phosphor has a decay time (t) of from about 0.050 µs to about 1.000 µs, from about 0.100 µs to about 0.223 µs, from about 0.746 µs to about 0.809 µs, or from about 0.050 µs, 0.100 µs, 0.150 µs, 0.200 µs, 0.250 µs, 0.300 µs, 0.350 µs, 0.400 µs, 0.450 µs, 0.475 µs, 0.500 µs, 0.550 µs, 0.600 µs, 0.650 µs, 0.675 µs, 0.700 µs, 0.750 µs, 0.800 µs, 0.850 µs, 0.900 µs, 0.950 µs, to about 1.000 µs, or any range derivable therein. In some embodiments, the phosphor has an excitation spectrum peak at an excitation wavelength from about 260 nm to about 450 nm, from about 260 nm to about 290 nm, or from about 260 nm, 265 nm, 270 nm, 275 nm, 300 nm, 325 nm, 330 nm, 335 nm, 340 nm, 345 nm, 350 nm, 365 nm, 375 nm, 385 nm, 390 nm, 395 nm, 400 nm, 405 nm, 410 nm, 415 nm, 425 nm, to about 450 nm, or any range derivable therein. In some embodiments, the phosphor has an emission spectrum peak at an emission wavelength from about 400 nm to about 500 nm, from about 425 nm to about 475 nm, or from about 400 nm, 410 nm, 420 nm, 430 nm, 440 nm, 450 nm, 460 nm, 470 nm, 480 nm, 490 nm, to about 500 nm, or any range derivable therein. In some embodiments, the emission spectrum peak has a full width at half-maximum (FWHM) of from about 50 nm to about 100 nm, from about 70 nm to about 90 nm, from about 75 nm to about 85 nm, or from about 50 nm, 55 nm, 60 nm, 65 nm, 70 nm, 75 nm, 80 nm, 85 nm, 90 nm, 95 nm, to about 100 nm, or any range derivable therein. In some embodiments, the photoluminescence quantum yield (PLQY) of the phosphor upon excitation at 365 nm is greater than about 80%, greater than about 90%, from about 80% to about 99.9%, or from about 80%, 81%, 82%, 83%, 84%, 85%, 86%, 87%, 88%, 89%, 90%, 91%, 92%, 93%, 94%, 95%, 96%, 97%, 98%, 99%, to about 99.9%, or any range derivable therein. In some embodiments, the PLQY of the phosphor upon excitation at 400 nm is greater than about 50%, greater than about 65%, from about 65% to about 99.9%, or from about 65%, 66%, 67%, 68%, 69%, 70%, 71%, 72%, 73%, 74%, 75%, 80%, 85%, 90%, 95%, to about 99.9%, or any range derivable therein.

II. Methods of Producing Phosphors of the Present Disclosure

In other aspects, the present disclosure provides methods for producing a phosphor of the present disclosure, wherein the method comprises:
  a) mixing starting materials of the phosphor to produce a first reaction mixture, wherein the starting materials of the phosphor comprise one or more alkali metal sources, a magnesium source, a phosphate source, a fluoride source, and a europium source; and
  b) heating the first reaction mixture to a first temperature to produce the phosphor.

In some embodiments, the starting materials of the phosphor comprise a single alkali metal source. In some embodiments, the alkali metal source is a sodium source. In some embodiments, the sodium source is a sodium salt, such as $Na_2CO_3$. In some embodiments, the magnesium source is a magnesium salt, such as MgO. In some embodiments, the phosphate source is a phosphate salt, such as $NH_4H_2PO_4$. In some embodiments, the fluoride source is a fluoride salt, such as $MgF_2$. In some embodiments, the europium source is a europium oxide, such as europium (III) oxide. In some embodiments, the first reaction is heated to the first reaction temperature in a furnace. In some embodiments, the first temperature is from about 725° C. to 925° C., from about 800° C. to about 900° C., from about 825° C. to about 875° C., or from about 725° C., 750° C., 775° C., 800° C., 825° C., 850° C., 875° C., 900° C., to about 925° C., or any range derivable therein.

In some embodiments, mixing is performed in air. In some embodiments, heating the first reaction mixture is performed in air. In other embodiments, heating the first reaction mixture is performed in a reducing atmosphere. In some embodiments, the reducing atmosphere comprises $H_2$, CO, or $NH_3$. In some embodiments, the reducing atmosphere comprises $H_2$. In some embodiments, the reducing atmosphere further comprises a diluent gas. In some embodiments, the diluent gas is $N_2$, helium, neon, argon, krypton, xenon, or any combination thereof. In some embodiments, the reducing atmosphere comprises argon. In some embodiments, the reducing atmosphere comprises $N_2$. In some embodiments, the reducing atmosphere comprises $H_2$ and argon. In some embodiments, the reducing atmosphere comprises $H_2$ and $N_2$. In some embodiments, the reducing atmosphere comprises from about 0.1% to about 25% $H_2$, from about 1% to about 10% $H_2$, or from about 0.1%, 0.2%, 0.3%, 0.4%, 0.5%, 1%, 2%, 3%, 4%, 5%, 10%, 15%, 20%, to about 25%, or any range derivable therein. In some embodiments, the reducing atmosphere comprises from about 75% to about 99.9% $N_2$, from about 90% to about 99% $N_2$, or from about 75%, 80%, 85%, 90%, 91%, 92%, 93%, 94%, 95%, 96%, 97%, 98%, 99%, to about 99.9%, or any range derivable therein.

III. Light-Emitting Devices Employing the Phosphors of the Present Disclosure In yet other aspects, the present disclosure provides light-emitting devices comprising:
 a) an excitation light source that emits primary light; and
 b) a phosphor of the present disclosure, wherein the phosphor is a blue-emitting phosphor.

In some embodiments, the phosphor is a blue-emitting phosphor. In some embodiments, the excitation light source is a semiconductor light source, such as a light-emitting diode (LED) or a laser diode (LD). In some embodiments, the primary light has a wavelength from about 350 nm to about 450 nm, from about 350 nm to about 390 nm, or from about 350 nm, 355 nm, 360 nm, 365 nm, 370 nm, 375 nm, 380 nm, 385 nm, 390 nm, 395 nm, 400 nm, 405 nm, 410 nm, 415 nm, 420 nm, 425 nm, 430 nm, 435 nm, 440 nm, 445 nm, to about 450 nm, or any range derivable therein. In some embodiments, the light-emitting device further comprises a green-emitting phosphor. In some embodiments, the light-emitting device further comprises a red-emitting phosphor. In some embodiments, the light-emitting device further comprises a green-emitting phosphor and a red-emitting phosphor.

IV. Definitions

The present disclosure provides inorganic compounds comprising atoms of one or more elements. In the context of the present disclosure, reference to an element is intended to refer to atoms of that element in any oxidation state. A non-limiting example is the term "sodium" (i.e., Na) which refers to both sodium metal (i.e., $Na^0$) and sodium(I) (i.e., $Na^+$).

A "repeat unit" is the simplest structural entity of certain materials, for example, frameworks and/or polymers, whether organic, inorganic or metal-organic. In the case of a polymer chain, repeat units are linked together successively along the chain, like the beads of a necklace. For example, in polyethylene, —[—$CH_2CH_2$—]$_n$—, the repeat unit is —$CH_2CH_2$—. The subscript "n" denotes the degree of polymerization, that is, the number of repeat units linked together. When the value for "n" is left undefined or where "n" is absent, it simply designates repetition of the formula within the brackets as well as the polymeric nature of the material. The concept of a repeat unit applies equally to where the connectivity between the repeat units extends three dimensionally, such as crystalline inorganic materials, metal organic frameworks, modified polymers, thermosetting polymers, etc.

The use of the word "a" or "an," when used in conjunction with the term "comprising" in the claims and/or the specification may mean "one," but it is also consistent with the meaning of "one or more," "at least one," and "one or more than one."

Throughout this application, the term "about" is used to indicate that a value includes the inherent variation of error for the device, the method being employed to determine the value, or the variation that exists among the study subjects or patients. When the term "about" is used in the context of X-ray diffraction peaks, the term is used to express variation in the peak of ±0.2 °2θ.

The terms "comprise," "have," and "include" are open-ended linking verbs. Any forms or tenses of one or more of these verbs, such as "comprises," "comprising," "has," "having," "includes," and "including," are also open-ended. For example, any method that "comprises," "has," or "includes" one or more steps is not limited to possessing only those one or more steps and also covers other unlisted steps.

The term "effective," as that term is used in the specification and/or claims, means adequate to accomplish a desired, expected, or intended result.

An "isomer" of a first compound is a separate compound in which each molecule contains the same constituent atoms as the first compound, but where the configuration of those atoms in three dimensions differs.

The above definitions supersede any conflicting definition in any reference that is incorporated by reference herein. The fact that certain terms are defined, however, should not be considered as indicative that any term that is undefined is indefinite. Rather, all terms used are believed to describe the invention in terms such that one of ordinary skill can appreciate the scope and practice the present invention.

As used herein, one or more of the following abbreviations may be used in the application: LED, light-emitting diode; pc-LED, phosphor-converted white light emitting diode; PLQY, photoluminescence quantum yield; CIE, Commission internationale de l'éclairage (i.e., International Commission on Illumination); NTSC, National Television System Committee; ITU-R, International Telecommunication Union-Radiocommunications Sector; UV, ultraviolet; $\lambda_{ex}$, excitation wavelength maximum; $\lambda_{em}$, emission wavelength maximum; nm, nanometer; h, hour; and rt, room temperature.

V. Examples

The following examples are included to demonstrate preferred embodiments of the invention. It should be appreciated by those of skill in the art that the techniques disclosed in the examples which follow represent techniques discovered by the inventor to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention.

Example 1: Phosphors of the General Molecular Formula $(Na_{2-2x}Eu_x)MgPO_4F$

A. Synthesis, Characterization, and Methods $(Na_{2-2x}Eu_x)MgPO_4F$ was prepared via solid-state reaction starting from $Na_2CO_3$ (Sigma Aldrich, 99.95%), MgO (Sigma Aldrich, 99.995%), $NH_4H_2PO_4$ (Acros Organics, 99.9%), $MgF_2$ (Sigma Aldrich, 99.99%), and $Eu_2O_3$ (Alfa Aesar, 99.99%) in the appropriate stoichiometric ratios. An additional 7.5 wt % of $Na_2CO_3$ was added to compensate for any potential evaporation during synthesis. The starting reagents were ground in an acetone medium using an agate mortar and pestle and pressed into a 6 mm diameter pellet. The pellet was placed on a bed of sacrificial powder in an alumina crucible (AdValue Technology) and sintered at 825° C. for 8 hours under flowing 5% $H_2$/95% $N_2$ gas with a heating and cooling rate of 3° C. per minute. Phase purity was confirmed by X-ray powder diffraction on a PanAnalytical X'Pert powder diffractometer using Cu Kα radiation (1.54183 Å) as well as high-energy synchrotron radiation using the 11-BM at the Advanced Photon Source (0.457868 Å).

The phase pure samples were deposited on quartz slide (Chemglass) after being mixed in an optically transparent silicone resin (GE Silicones, RTV 615). Photoluminescent spectra were recorded on a PTI fluorescence spectrophotometer with a 75 W xenon arc lamp for excitation. Temperature-dependent emission spectra were obtained using a Janis cryostat (VPF-100) for a temperature-controlled environment from 80-640 K. The internal photoluminescent quantum yield was determined following the methodology of de Mello et al. and using a Spectralon coated integrating sphere (Labsphere) with an inner diameter of 150 mm (de Mello et al., 1997). To account for any trapping/de-trapping of electrons was accounted for by wrapping the sample in foil and heating for 5 minutes in the dark after each measurement at 140° C. on a hot plate. Luminescent decay curves were obtained using a NanoLED N-330 nm LED and a Horiba DeltaFlex™ Lifetime System. Fabrication of a pc-LED involved the use of the title phosphor, commercially available β-SiAlON:$Eu^{2+}$, and lab-made $Sr_2Si_5N_8$:$Eu^{2+}$. The ratio of each phosphor was optimized to 2.88 wt % $Sr_2Si_5N_8$:$Eu^{2+}$, 22.3 wt % $(Na_{1.92}Eu_{0.04})MgPO_4F$, and 1.8 wt % of β-SiAlON:$Eu^{2+}$ for the 370 nm LED powered device and 4.23 wt % $Sr_2Si_5N_8$:$Eu^{2+}$, 52 wt % $(Na_{1.92}Eu_{0.04})MgPO_4F$, and 2.94 wt % of β-SiAlON:$Eu^{2+}$ for the 405 nm LED device. The phosphors were weighed out in the appropriate ratios and mixed in the GE silicone resin. The phosphor "cap" was prepared by curing the phosphor resin in a custom brass mold and excited using a 405 nm LED driven by a forward bias of 20 mA. The pc-LED luminescence spectrum and performance were characterized using an Avasphere-5-IRRAD spectrophotometer and AvaSoft 8 software.

B. Results

The successful synthesis of $(Na_{2-2x}Eu_x)MgPO_4F$ involves the sintering of oxide and fluoride precursors at moderate temperatures in a reducing environment. This direct synthetic method is highly scalable and is likely capable of producing multiple grams of the product in a single reaction step. The powder X-ray diffractograms of these materials can be seen in FIG. 1. The peaks index exactly to the reported pattern of the $Na_2MgPO_4F$ host, indicated by the grey, solid lines. Scanning electron microscopy (SEM) revealed that the host is composed of particles with irregular morphology with an average particle size of 8 μm. The average composition of the host was determined as $Na_{1.96}Mg_{1.14}PO_{4.3}F_{1.16}$ from energy dispersive X-ray spectroscopy and closely resembles the nominally loaded composition.

Figure 2:
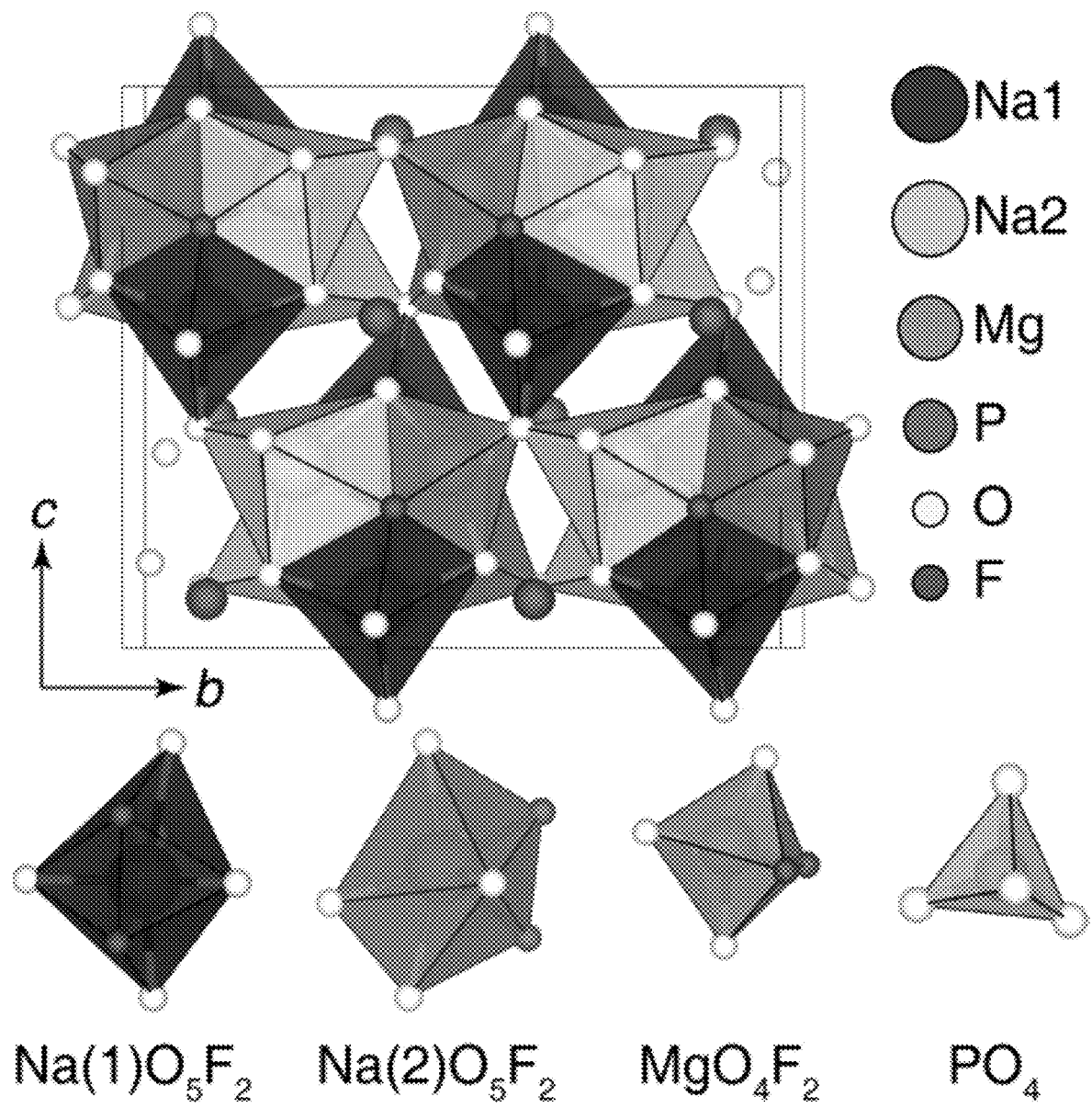
FIG. 2 shows the crystal structure of $Na_2MgPO_4F$ composed of $NaO_5F_2$, $MgO_4F_2$, and $PO_4$ polyhedra.

As illustrated in FIG. 2, the crystal structure of $Na_2MgPO_4F$ crystallizes in the orthorhombic space group Pbcn (space group no. 60). The structure is composed of a backbone of $Na_2MgF_2O_{11}$ units. The unit can be broken into four Na-centered and two Mg-centered polyhedra. Five oxygen atoms and two fluorine atoms coordinate two crystallographically independent Na atoms, and the Mg atoms are octahedrally coordinated by four oxygen and two fluorine atoms (Swafford and Holt, 2002). All of the polyhedra are face sharing, composing the overall $Na_2MgF_2O_{11}$ cluster. Phosphorous atoms are tetrahedrally coordinated by oxygen and lie between the clusters. The $Eu^{2+}$ atoms are likely to substitute on the $Na^+$ sites despite being isovalent with $Mg^{2+}$. This is because $Eu^{2+}$ (r6-coord=1.17 Å; r7-coord=1.20 Å) is closer in size to $Na^+$ (r7-coord=1.12 Å) than $Mg^{2+}$ (r6-coord=0.720; Shannon, 1976).

Figures 3A, 3B, 3C:
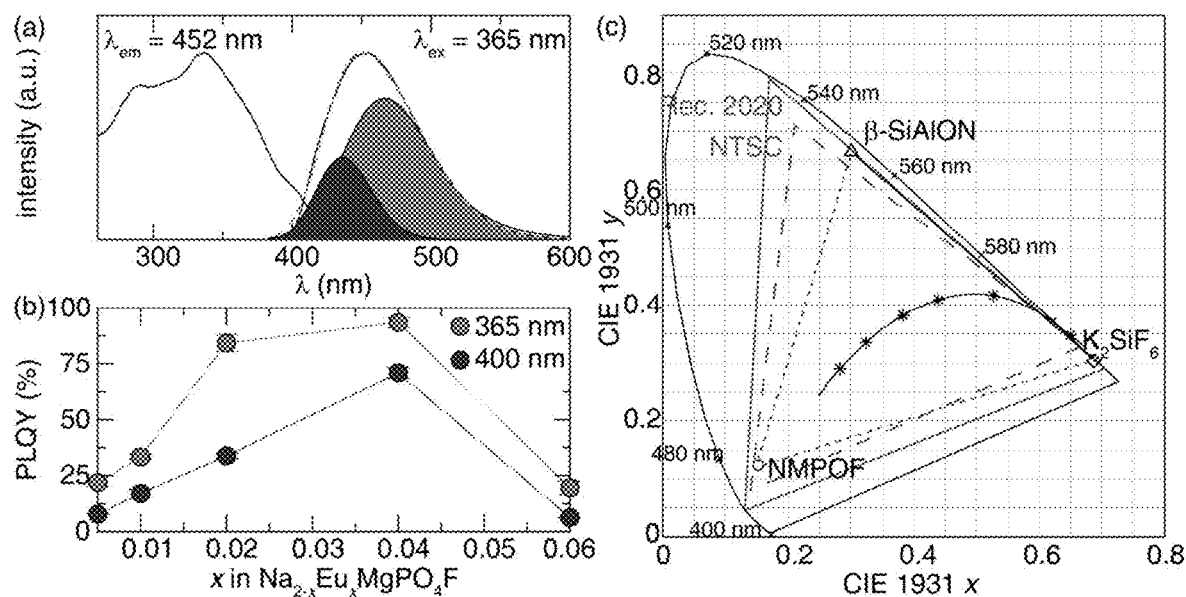
FIGS. 3A-3C show photochemical properties of the blue-emitting phosphors.

Substituting $Eu^{2+}$ for $Na^+$ following $(Na_{2-2x}Eu_x)MgPO_4F$ (x=0.005, 0.01, 0.02, 0.04 and 0.06) yields a bright blue emission upon excitation from 260 nm-450 nm. There are three main peaks in the excitation spectrum centered at approximately 275, 340, and 400 nm (FIG. 3A). The broad excitation range allows these phosphors to be used in a variety of applications, depending on the excitation maximum. The emission spectrum when $\lambda_{ex}$=365 nm can be seen in FIG. 3A depicting a narrow (fwhm≈79 nm; 3782 $cm^{-1}$) peak emission centered at ≈450 nm. The emission curve can be fit to two separate emissions corresponding to the two crystallographically independent Na sites. The integrated area of the two Gaussians are in an approximate 1:3 ratio and are separated by 1500 $cm^{-1}$. Exciting these phosphors with a 400 nm source shows no change in the emission peak shape and position.

Integration into pc-LED devices requires that the phosphor must also be highly efficient. Thus, the room temperature photoluminescent quantum yield (PLQY) was measured to determine the optimal $Eu^{2+}$ concentration. As the $(Na_{2-2x}Eu_x)MgPO_4F$ (x=0.005, 0.01, 0.02, 0.04, and 0.06) phosphors have a broad excitation range, the PLQY was also measured using a 365 and 400 nm excitation source to understand the efficiency behavior across the n-UV to the visible region. As seen in FIG. 3B, the PLQY upon 365 nm excitation reaches a maximum of 93% when x=0.04. Further increasing the $Eu^{2+}$ concentration to x=0.06 causes the PLQY to drop off to 22% due to concentration quenching. Exciting at the longer wavelength of 400 nm causes the PLQY of $(Na_{1.92}Eu_{0.04})MgPO_4F$ to decrease slightly to 71% (FIG. 3B). Despite the slight loss in emission efficiency upon 400 nm excitation, it is very uncommon to produce blue emission from a visible excitation source, making $(Na_{1.92}Eu_{0.04})MgPO_4F$ unique and well-suited for devices utilizing these visible light excitation sources. The efficiency of $Na_{1.92}Eu_{0.04}MgPO_4F$ is also comparable to the industry standard BAM:$Eu^{2+}$. Under 365 nm excitation, BAM:$Eu^{2+}$ has a PLQY of 95% which is very similar to the 93% in $Na_{1.92}Eu_{0.04}MgPO_4F$. At 400 nm excitation, the efficiency of commercial BAM:$Eu^{2+}$ is 90% which is higher than $Na_{1.92}Eu_{0.04}MgPO_4F$ (71%). The PLQY of $Na_{1.92}Eu_{0.04}MgPO_4F$ can still be improved through industrial post-processing techniques. The efficiency of $Na_{1.92}Eu_{0.04}MgPO_4F$ across the n-UV to the visible region and deep blue CIE coordinates indicate that this phosphor is viable for integration in pc-LED devices.

The emission color of the phosphor can be visualized by integrating the emission spectrum across the tri-stimulus function and plotting the obtained coordinates on a 1931 CIE diagram, as seen in FIG. 3C. The CIE coordinates (circle) depict the deep-blue emission of $(Na_{1.92}Eu_{0.04})MgPO_4F$. The emission coordinates $(Na_{1.92}Eu_{0.04})MgPO_4F$ lies close to the blue corner of the National Television System Committee (NTSC) color triangle, plotted as the dashed grey line, and the ITU-R Recommendation BT.2020 (Rec. 2020) triangle seen as the solid grey line. To ascertain the available color gamut from using this blue-emitter, the CIE coordinates of green-emitting β-SiAlON:$Eu^{2+}$ (triangle) and red-emitting $Sr_2Si_5N_8$:$Eu^{2+}$ (diamond) were also plotted. The gamut created from these three phosphors covers 86% of the NTSC triangle and 60% of the Rec. 2020 triangle indicating that over half of the necessary color gamut is achieved when using $(Na_{1.92}Eu_{0.04})MgPO_4F$ as the blue source.

The optical properties of $(Na_{2-2x}Eu_x)MgPO_4F$ were further probed by measuring the luminescent lifetime by fitting the decay curves to a bi-exponential following Equation 1 where I is intensity, I0, A1, and A2 are pre-exponential constants, τ1 and τ2 are decay times for exponential components in microseconds, and t is the measured time.

$$I = I_0 + A_1 e^{\frac{-t}{\tau_1}} + A_2 e^{\frac{-t}{\tau_2}} \qquad \text{Equation 1}$$

Figure 4:
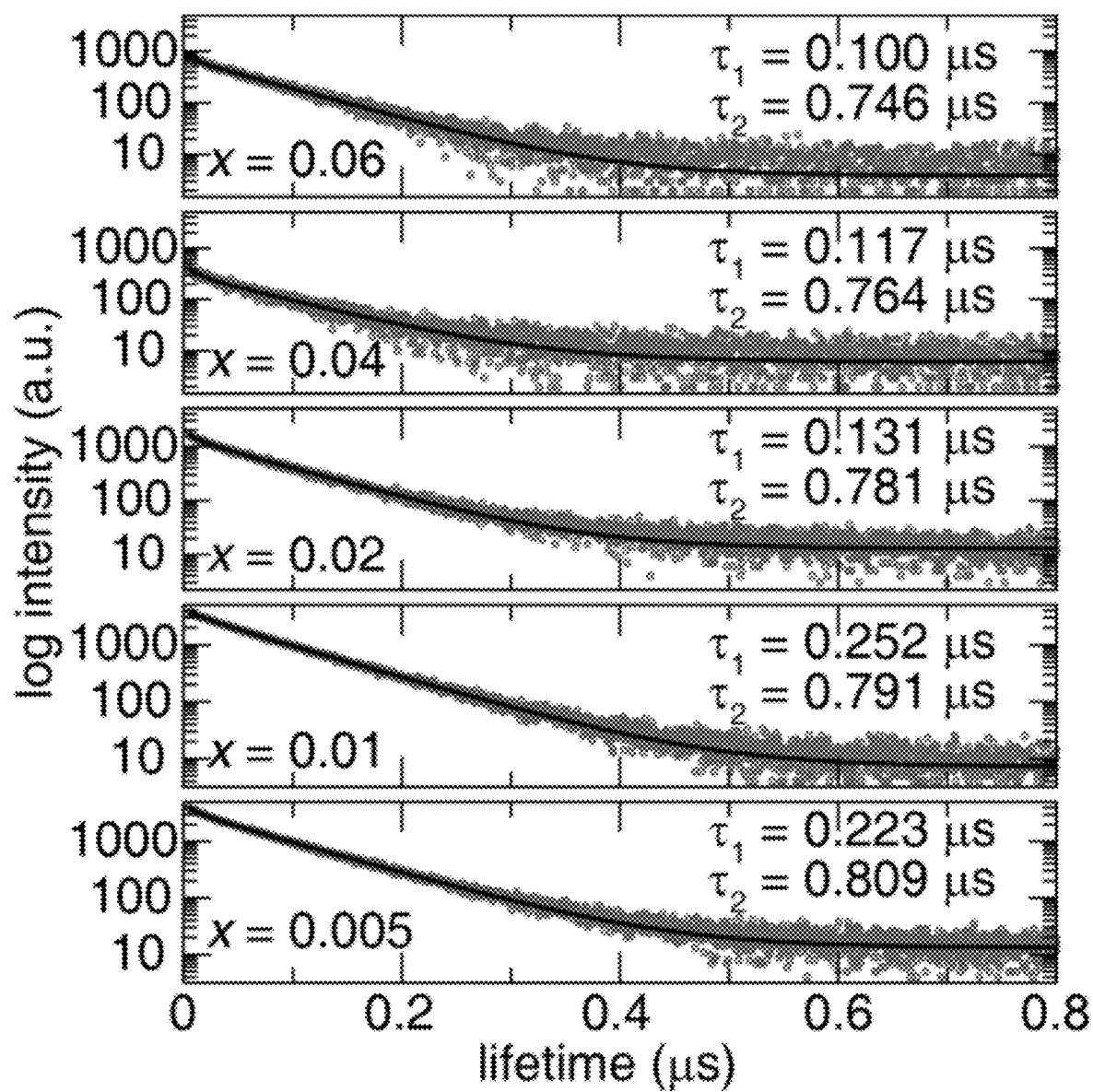
FIG. 4 shows photoluminescent decay curves (grey circles) and fit (black line) upon 363 nm excitation.

The luminescent decay curve and fit, represented by the grey circles and black line, respectively, can be seen in FIG. 4. The fit captures the entire decay and yields two lifetimes. The lifetimes become progressively shorter across the entire range of x in $(Na_{2-2x}Eu_x)MgPO_4F$ (x=0.005, 0.01, 0.02, 0.04 and 0.06) with one fast component (0.100 μs-0.223 μs) and one long component (0.746 μs-0.809 μs). The short luminescent lifetime is advantageous to prevent saturation effects in pc-LEDs.

Figures 5A, 5B:
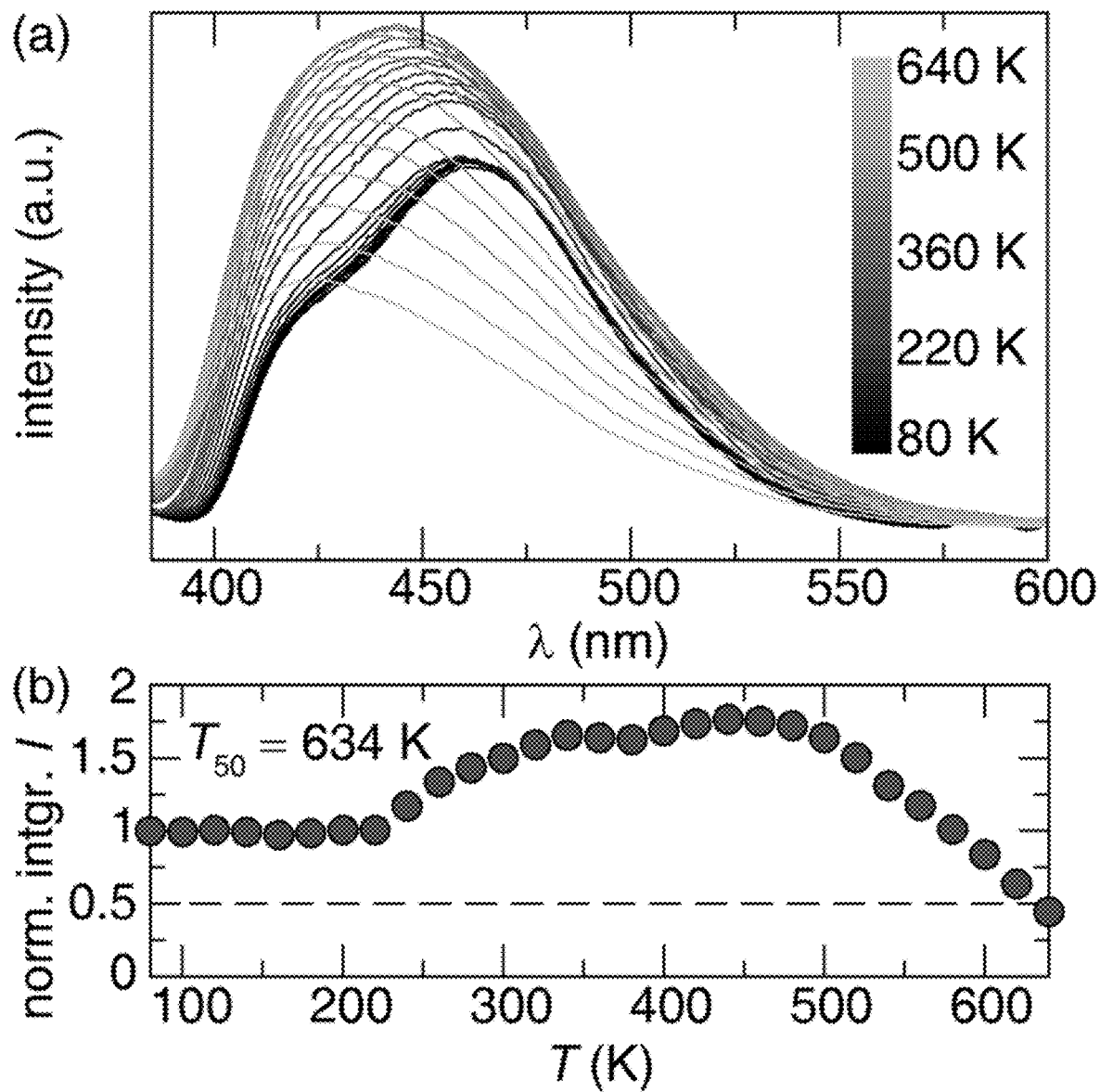
FIGS. 5A & 5B show the emission spectra from 80 K (black) to 640 K (grey) (FIG. 5A), and the normalized, integrated intensity of the emission spectra plotted as a function of temperature (FIG. 5B).

When developing new phosphors for use in pc-LEDs, the emission must be stable at elevated temperatures. Indeed, pc-LEDs operate at high temperatures, which may negatively impact the emission peak shape and wavelength of the phosphor. Thermally robust phosphors, thus, must be identified prior to integration into pc-LEDs. The thermal stability of a phosphor is quantified by the Tso or the temperature at which the emission intensity is 50% of the low-temperature intensity. The emission spectra of $(Na_{1.92}Eu_{0.04})MgPO_4F$ was thus measured from 80-640 K and plotted in FIG. 5A. At 80 K (black), the two emissions from the two crystallographically independent Na sites can be resolved. Incrementally increasing the temperature causes a higher energy peak to increase in intensity, before the low energy peak beings to preferentially quench (grey). The normalized, integrated area of each emission peak was then plotted in FIG. 5B to determine the Tso. The integrated area remains steady until 200 K, but further increasing the temperature causes the intensity to increase, presumably due to the release of electrons from defect trap states. The trap states likely stem from a charge compensation mechanism from the aliovalent substitution of $Eu^{2+}$ for $Na^+$. The intensity continually increases due to de-trapping until 460 K when quenching begins. The Tso of the phosphor was determined to be 634 K, which surpasses the operating temperatures of most LED lights (423 K). The origin of the thermal quenching resistance can be attributed to the wide band gap ($E_{g,HSE06}$=6.47 eV) and densely packed crystal structure which limits access to non-radiative relaxation pathways. The excellent thermal stability of this phosphor makes it a promising candidate for high powered pc-LED lighting.

Figures 6A, 6B:
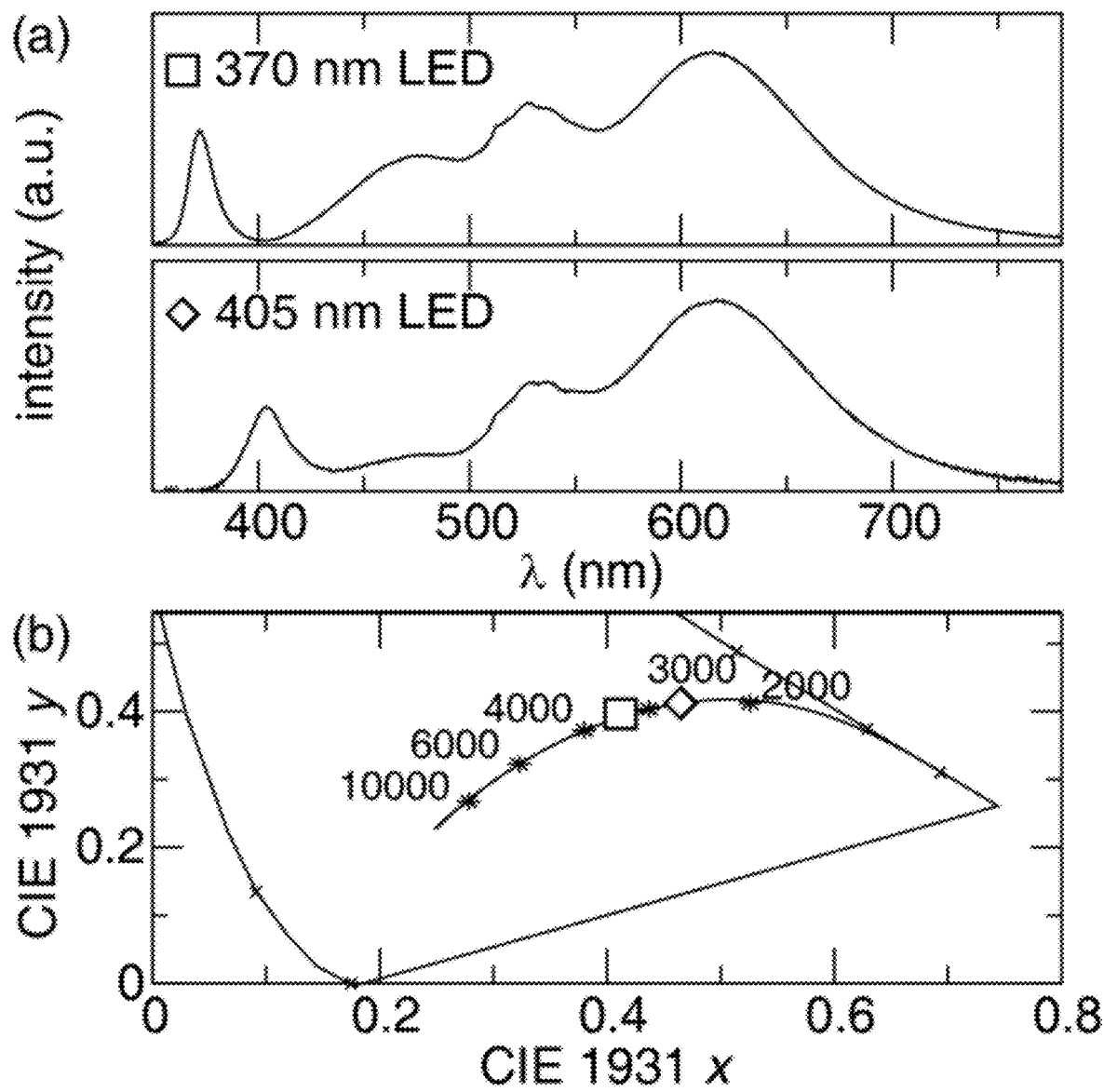
FIGS. 6A & 6B show the obtained white light spectrum (FIG. 6A) and CIE coordinates of the pc-LED composed of $(Na_{1.92}Eu_{0.04})MgPO_4F$, β-SiAlON:$Eu^{2+}$, $Sr_2Si_5N_8$:$Eu^{2+}$, and a 405 nm LED driven by a 20 mA forward bias (FIG. 6B).

To highlight the potential of $(Na_{1.92}Eu_{0.04})MgPO_4F$ for energy efficient solid-state lighting, $(Na_{1.92}Eu_{0.04})MgPO_4F$ was integrated into a pc-LED as the blue-emitting component. The broad excitation spectrum of $(Na_{1.92}Eu_{0.04})MgPO_4F$ provides a unique opportunity to construct two prototype devices, one driven by a 370 nm LED (square) and the other with a 405 nm (triangle) LED. Both LEDs are driven by a 20 mA forward bias. The phosphor blend consisted of $(Na_{1.92}Eu_{0.04})MgPO_4F$, green-emitting β-SiAlON:$Eu^{2+}$, red-emitting $Sr_2Si_5N_8$:$Eu^{2+}$. FIG. 6A shows the full-spectrum white light obtained. The emission band of $(Na_{1.92}Eu_{0.04})MgPO_4F$ is wide enough to cover the cyan region of the visible spectrum, whereas devices utilizing BAM:$Eu^{2+}$ leave an undesirable gap in the cyan region due to its narrow emission, which inhibits its ability to obtain a true full-spectrum white light (Zhong et al., 2020). The color coordinates of the obtained white light were plotted on a 1931 CIE diagram (FIG. 6B). The coordinates lie on the Planckian locus, meaning the emission closely resembles the emission of a black body radiator. Finally, the white light can be further assessed by the color rendering index (Ra) and correlated color temperature (CCT). The device driven by the 370 nm LED has an impressive Ra of 95.2 and a CCT of 3456.8 K indicating that a cool white light can be obtained. Utilizing a 405 nm source produces a white light with an Ra of 93.4 and a CCT of 2710 K. The warm white light produced in this device closely mirrors the color properties of a tungsten filament light bulb. These results express the suitability of $(Na_{2-2x}Eu_x)MgPO_4F$ (x=0.005, 0.01, 0.02, 0.04 and 0.06) phosphors for integration into pc-LEDs for next-generation, color tunable energy efficient lighting.

Figures 7A, 7B:
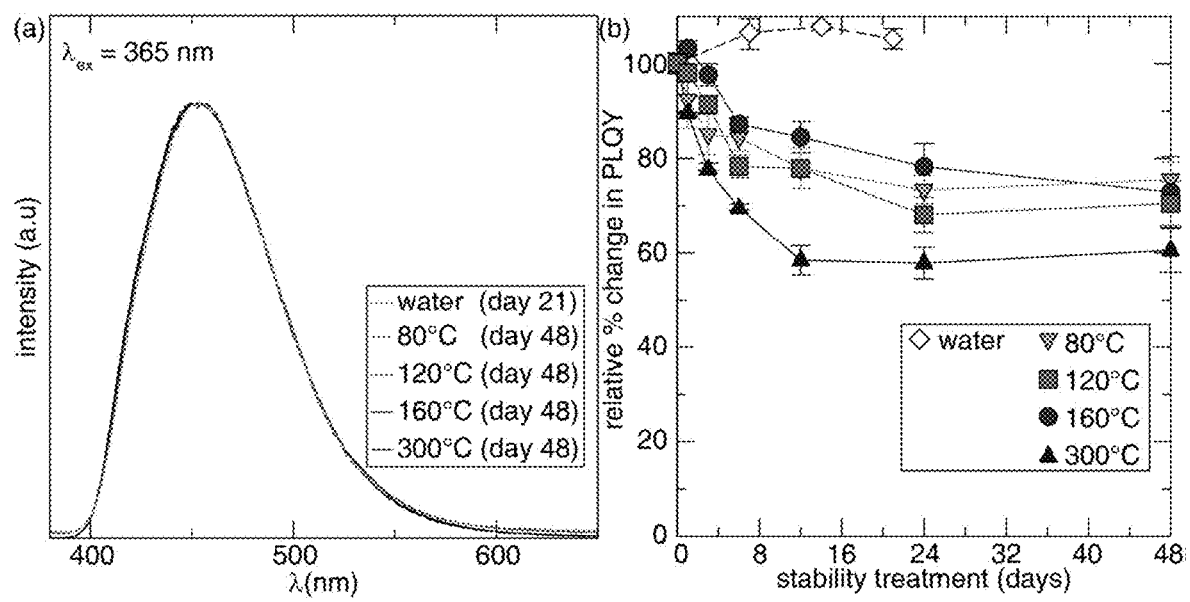
FIGS. 7A & 7B shows the stability of the phosphors under hydrolysis conditions.

The intense operation conditions experienced by a phosphor when integrated into a pc-LED can drastically affect the observed optical properties. Indeed, the heat generated from the LED can cause oxidation of the rare-earth and subsequent loss in the emission efficiency while ambient moisture may negatively impact a phosphor's emission wavelength and intensity. The stability of $(Na_{1.92}Eu_{0.04})MgPO_4F$ against oxidation resistance was therefore investigated by annealing fresh powder at 80, 120, 160, and 300° C. for a total of 48 days. The effect of hydrolysis was also determined by immersing the phosphor in deionized water for 21 days. The effect of the stability treatment was analyzed by incrementally measuring the emission spectra and room temperature photoluminescent quantum yield (PLQY). Monitoring the emission spectra upon 365 nm excitation after 48 days of annealing and 21 days in water, as shown in FIG. 7A, reveals virtually no change in the normalized emission peak shape, position, and full width at half maximum irrespective of the environment. The emission spectrum of BAM: $Eu^{2+}$ also remains unaffected upon annealing, however, similar water stability tests showed that hydration caused the emission peak to broaden and red-shift by approximately 10 nm (330 $cm^{-1}$; Mishra et al., 2005). This suggests that the emission curve of $(Na_{1.92}Eu_{0.04})MgPO_4F$ is resistant to changes in temperature and humidity.

Interestingly, the only observable effect of hydration and annealing on $(Na_{1.92}Eu_{0.04})MgPO_4F$ was a change in the measured internal PLQY (FIG. 7B). The samples of $(Na_{1.92}Eu_{0.04})MgPO_4F$ immersed in water showed a slight increase in the PLQY likely due to a decrease in the overall particle size which minimizes quenching from particle-particle interactions. The annealed samples, however, showed the opposite trend. There is a steady decrease in the PLQY up to 12 days of annealing, followed by a plateau upon further annealing. Overall, there is approximately a 25% loss in the PLQY after 48 days of annealing at 80, 120, and 160° C. and a 40% loss after annealing at 300° C. for 48 days. This decrease is due to the oxidation of the rare-earth from $Eu^{2+}$ to $Eu^{3+}$. Emission from $Eu^{3+}$ can be seen upon 390 nm excitation which increases in intensity as a function of annealing time. The behavior is not uncommon for $Eu^{2+}$-substituted phosphors and can also be seen in BAM: $Eu^{2+}$ and oxyhalide phosphors such as $(Sr/Ba/Ca)_{10}(PO_4)_6Cl_2$:$Eu^{2+}$ where prolonged annealing causes oxidation of the rare-earth and a subsequent loss in emission efficiency (Oshio, 1998). Ultimately, $(Na_{1.92}Eu_{0.04})MgPO_4F$ can still be considered to be robust with respect to annealing and humidity as over half of the photoluminescent quantum yield is retained after the applied stability treatments.

All of the compositions and methods disclosed and claimed herein can be made and executed without undue experimentation in light of the present disclosure. While the compositions and methods of this disclosure have been described in terms of preferred embodiments, it will be apparent to those of skill in the art that variations may be applied to the compositions and methods and in the steps or in the sequence of steps of the method described herein without departing from the concept, spirit and scope of the disclosure. More specifically, it will be apparent that certain agents which are both chemically and physiologically related may be substituted for the agents described herein while the same or similar results would be achieved. All such similar substitutes and modifications apparent to those skilled in the art are deemed to be within the spirit, scope and concept of the disclosure as defined by the appended claims.

VI. References

The following references to the extent that they provide exemplary procedural or other details supplementary to those set forth herein, are specifically incorporated herein by reference.

Anderson, *Practical Process Research & Development—A Guide for Organic Chemists*, $2^{nd}$ ed., Academic Press, New York, 2012.

*Handbook of Pharmaceutical Salts: Properties, and Use*, Stahl and Wermuth Eds., Verlag Helvetica Chimica Acta, 2002.

Reagan-Shaw et al., *FASEB J.*, 22(3):659-661, 2008.

Smith, *March's Advanced Organic Chemistry: Reactions, Mechanisms, and Structure*, $7^{th}$ Ed., Wiley, 2013.

de Mello et al., *Adv. Mater.*, 9:230-232, 1997.

Duke et al., *Chem. Mater.*, 30:2668-2675, 2018.

International Telecommunications Union-Radiocommunication Sector BT.2020, approved Oct. 14, 2015.

Liao et al., *Angew. Chem. Int. Ed.*, 57:11728-11731, 2018.

Mishra et al., *J. Electrochem. Soc.*, 152:H183-H190, 2005.

Oshio, *J. Electrochem. Soc.*, 145:3903, 1998.

Schubert and Kim, *Science*, 308:1274-1278, 2005.

Shannon, *Acta Crystallogr. Sect. A: Found. Crystallogr.*, A32:751-767, 1976.

Swafford et al., *Solid State Sci.*, 4:807-812, 2002.

United States Dept. of Energy, Navigant Consulting Inc., 2016.

Xie et al., *Appl. Phys. Express*, 2:022401, 2009.

Zhong et al., *Chem. Mater.*, 32:882-888, 2020.

The invention claimed is:

1. A phosphor of the general molecular formula:

$(A_{2-2x}Eu_x)MgPO_4F$, wherein:

A is one or more alkali metal;

$0 < x \leq 0.25$.

2. The phosphor of claim 1, wherein A is sodium (I).

3. The phosphor of claim 1, wherein $0 < x \leq 0.1$.

4. The phosphor of claim 1, wherein x is 0.005, 0.01, 0.02, 0.04, or 0.06.

5. The phosphor of claim 1, further defined as $Na_{1.92}Eu_{0.04}MgPO_4F$.

6. The phosphor of claim 1, wherein the phosphor has an excitation spectrum peak at an excitation wavelength from about 260 nm to about 450 nm.

7. The phosphor of claim 1, wherein the phosphor has an emission spectrum peak at an emission wavelength from about 400 nm to about 500 nm.

8. The phosphor of claim 1, wherein the emission spectrum peak has a full width at half-maximum (FWHM) of from about 50 nm to about 100 nm.

9. A method for producing a phosphor of claim 1, wherein the method comprises:
   a) mixing starting materials of the phosphor to produce a first reaction mixture, wherein the starting materials of the phosphor comprise one or more alkali metal sources, a magnesium source, a phosphate source, a fluoride source, and a europium source; and
   b) heating the first reaction mixture to a first temperature to produce the phosphor, wherein the method comprises a single heating step.

10. The method of claim 9, wherein the alkali metal source is a sodium source.

11. The method of claim 9, wherein the phosphate source is a phosphate salt.

12. The method of claim 9, wherein the europium source is a europium salt or a europium oxide.

13. The method of claim 9, wherein the first temperature is from about 725° C. to 925° C.

14. The method of claim 9, wherein mixing is performed in air and heating is performed in a reducing atmosphere.

15. The method of claim 14, wherein the reducing atmosphere further comprises a diluent gas.

16. A light-emitting device comprising:
   a) an excitation light source that emits primary light; and
   b) a phosphor of claim 1, wherein the phosphor is a blue-emitting phosphor.

17. The light-emitting device of claim 16, wherein the excitation light source is a semiconductor light source.

18. The light-emitting device of claim 16, wherein the primary light has a wavelength from about 350 nm to about 450 nm.

19. The light-emitting device of claim 16, wherein the light-emitting device further comprises a green-emitting phosphor, a red-emitting phosphor, or a combination thereof.

* * * * *